(12) United States Patent
Pan et al.

(10) Patent No.: US 9,737,915 B2
(45) Date of Patent: Aug. 22, 2017

(54) PURGE DEVICES HAVING MICRONOZZLES AND OPERATING METHODS THEREOF

(71) Applicant: GUDENG PRECISION INDUSTRIAL CO., LTD, New Taipei (TW)

(72) Inventors: Yung-Chin Pan, New Taipei (TW); Zhi-Huang Zhong, New Taipei (TW); An-Pang Wang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 141 days.

(21) Appl. No.: 14/740,664

(22) Filed: Jun. 16, 2015

(65) Prior Publication Data

US 2016/0300735 A1    Oct. 13, 2016

(30) Foreign Application Priority Data

Apr. 7, 2015  (TW) .............................. 104111105 A

(51) Int. Cl.
  *B08B 5/02*   (2006.01)
  *H01L 21/67*  (2006.01)
  *A47L 9/08*   (2006.01)

(52) U.S. Cl.
  CPC  *B08B 5/02* (2013.01); *A47L 9/08* (2013.01); *H01L 21/67028* (2013.01)

(58) Field of Classification Search
  CPC ....... B08B 5/00; B08B 5/02; H01L 21/67028; A47L 9/08
  See application file for complete search history.

(56) References Cited

U.S. PATENT DOCUMENTS

| 5,806,138 A * | 9/1998 | Kawasaki ................. B08B 5/02 15/303 |
| 2005/0205113 A1* | 9/2005 | Tamada .............. H01L 21/6715 134/26 |

FOREIGN PATENT DOCUMENTS

| CN | 103995434 A | 8/2014 |
| TW | M285024 U | 1/2006 |

* cited by examiner

*Primary Examiner* — Saeed T Chaudhry
(74) *Attorney, Agent, or Firm* — Cheng-Ju Chiang

(57) ABSTRACT

The present invention provides purge devices having micronozzles and operating methods thereof. The purge device having micronozzles are operated to clean pellicles used in semiconductor manufacturing. The purge devices having micronozzles comprises a base, at least one track configured on the base, a rotation platform, and a micronozzle array, in which the micronozzle array further comprises an air duct and a plurality of nozzles. Additionally, the rotation platform and the micronozzle array are able to move relatively to another along the at least one track.

15 Claims, 8 Drawing Sheets

PURGE DEVICES HAVING MICRONOZZLES AND OPERATING METHODS THEREOF

CROSS-REFERENCE TO RELATED APPLICATION AND CLAIM OF PRIORITY

This application claims the benefit of Taiwan Patent Application No. 104111105, filed on Apr. 7, 2015, in the Taiwan Intellectual Property Office, the disclosure of which is incorporated herein in its entirety by reference.

1. Technical Field

The present invention relates to a purge device to clean semiconductors or photolithographic masks in semiconductor manufacturing. More particularly, the purge device comprises a rotation platform and a micronozzle array.

2. Description of the Related Art

In the semiconductor industry, the cleanliness of semiconductors and photolithographic masks plays an important role in semiconductor manufacturing. Pollutants on semiconductors or photolithographic masks usually result in defects on wafers. And the most common method to remove the pollutants is by purging the pellicles with filter guns. However, the purging process with filter gun requires close contact between the filter gun and the pellicle, spaced at millimeter-scale, and the purging angle is manually changed in 360° to purge the pellicle. The manual process usually leads to accidental damages on pellicles and photolithographic masks. One exemplary damage is that the filter gun may accidently scratch on or penetrate through the pellicles. This is one of the problems needed to be solved in the semiconductor industry.

Several purge devices have been proposed to ameliorate the problems from manually operating the filter guns. One of the purge devices is provided in China Patent Application Publication No. 103995434. The purge device utilizes a rotatable suspension system to support nitrogen knives to purge the bottom surfaces of photolithographic masks. The rotatable suspension system maintains the nitrogen knives and the photolithographic masks in a constant distance and therefore prevents the pellicles from being damaged during the manual operation of filter guns.

One disadvantage of China Patent Application Publication No. 103995434 is that some zone is unreachable by the purge device and thus the particle removal efficiency (PRE) of the purge device is low. On the other hand, Taiwan Patent No. M285024 provides a rotatable device to purge photolithographic masks. The rotatable device utilizes centrifugal force to rapidly remove pollutants and chemical purgers on the subjects. The rotatable device may cooperate with chemical purgers to dissolve and remove pollutants. Furthermore, the chemical purgers and the airflow induced by the rotatable device together may further generate a moisturized environment to improve the PRE of the rotatable device.

One disadvantage of Taiwan Patent No. M285024 is that the rotatable device is a wet cleaning system and thus requires an additional step of blow-drying after the wet cleans. Another disadvantage of the rotatable device is that even though the rotation platform, used to support the photolithographic masks, in the rotatable device is able to freely rotate in 360°, the nozzles are still fixed and thus some zone on the photolithographic masks is unreachable. Accordingly, there is a need for a purge device based on dry cleaning system. And the configuration and operation of the purge device may effectively reduce unreachable zones on photolithographic masks.

SUMMARY

At least one embodiment of the present invention provides purge devices having micronozzles and operating methods thereof. The purge device having micronozzles comprises a base, at least one track configured on the base, a rotation platform, and a micronozzle array. More particularly, the micronozzle array further comprises an air duct and a plurality of nozzles, in which the air duct is connected with the nozzles.

The at least one track may be connected with the rotation platform and/or the micronozzle array under different embodiments. In a first group of embodiments, the micronozzle array is connected with the at least one track, while the rotation platform is configured on the base. In a second group of embodiments, the micronozzle array is configured on the base, while the rotation platform is connected with the at least one track. In a third group of embodiments, both the micronozzle array and the rotation platform are connected with the at least one track, in which the micronozzle array and the rotation platform may either share the same track or be connected with different tracks.

Accordingly, the operating methods of purge devices having micronozzles may be modified under different embodiments. In a first group of embodiments, a subject (i.e., a photolithographic mask) is placed onto the rotation platform, and the rotation platform is then rotating while the micronozzle array is activated to slide along the at least one track to purge the subject. In a second group of embodiments, a subject is placed onto the rotation platform, and the rotation platform is then rotating and sliding along the at least one track while the micronozzle array is activated to purge the subject. In a third group of embodiments, a subject is placed onto the rotation platform, and the rotation platform is then rotating and sliding along the at least one track while the micronozzle array is activated to slide along the at least one track to purge the subject.

At least one embodiment provided in the present invention improves the purging efficiency by manipulating the relative movement between the rotation platform and the micronozzles. Since the rotation platform enable 360° rotation and the micronozzle array is able to move over the entire photolithographic mask, the purge device having micronozzles may effectively reduce unreachable zones. Moreover, the distance and angle between the rotation platform and the micronozzle array are mechanically controlled, thus pellicles are well-protected from mechanical damages.

DESCRIPTION OF THE PREFERRED EMBODIMENTS

At least one embodiment of the present invention provides a purge device. More particularly, at least one embodiment of the present invention provides a purge device having micronozzles. Most of the elements and configuration in the embodiment are based on known techniques. The examples depicted in the following sections are provided for the purpose of detailed explanation of the features of the embodiment.

Figure 1:
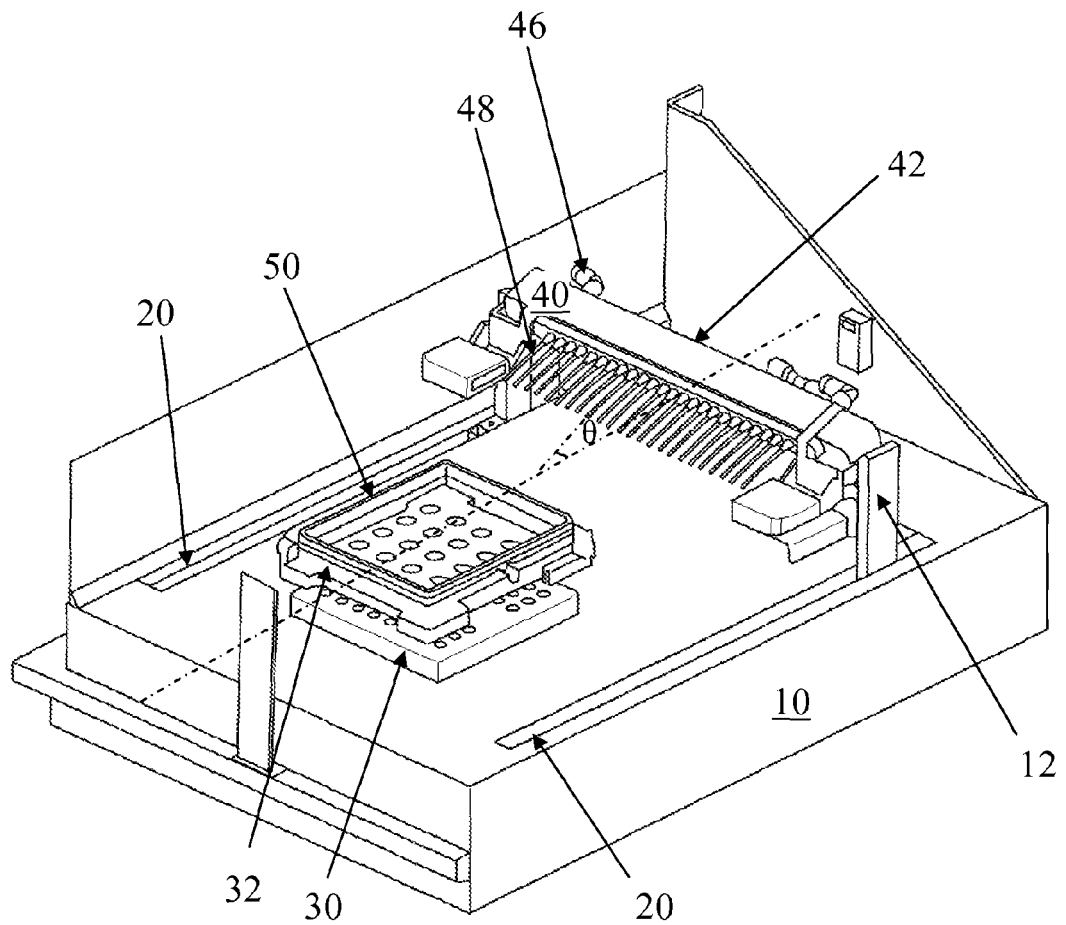
FIG. 1 is a schematic diagram illustrating a purge device having micronozzles according to some embodiments of the present invention.

FIG. 1 is a schematic diagram illustrating a purge device having micronozzles according to some embodiments of the present invention. The purge device having micronozzles comprises a base 10, at least one track 20 configured on the base 10, a rotation platform 30, and a micronozzle array 40. The micronozzle array 40 further comprises an air duct 42 and a plurality of nozzles 48, in which the nozzles 48 are connected with the air duct 42 and the air duct 42 is further connected with an external channel 46. Moreover, the base 10 may further comprises a carrier arm 12 configured to support the micronozzle array 40.

The rotation platform 30, on the other hand, comprises a holder 32 configured to accommodate and hold a photolithographic mask 50. The holder 32 may be a square frame, a bracket, a pyramid, or a clasp. However, other forms of holder suitable for holding and fixing photolithographic masks 50 may be used in other embodiments.

Figure 2:
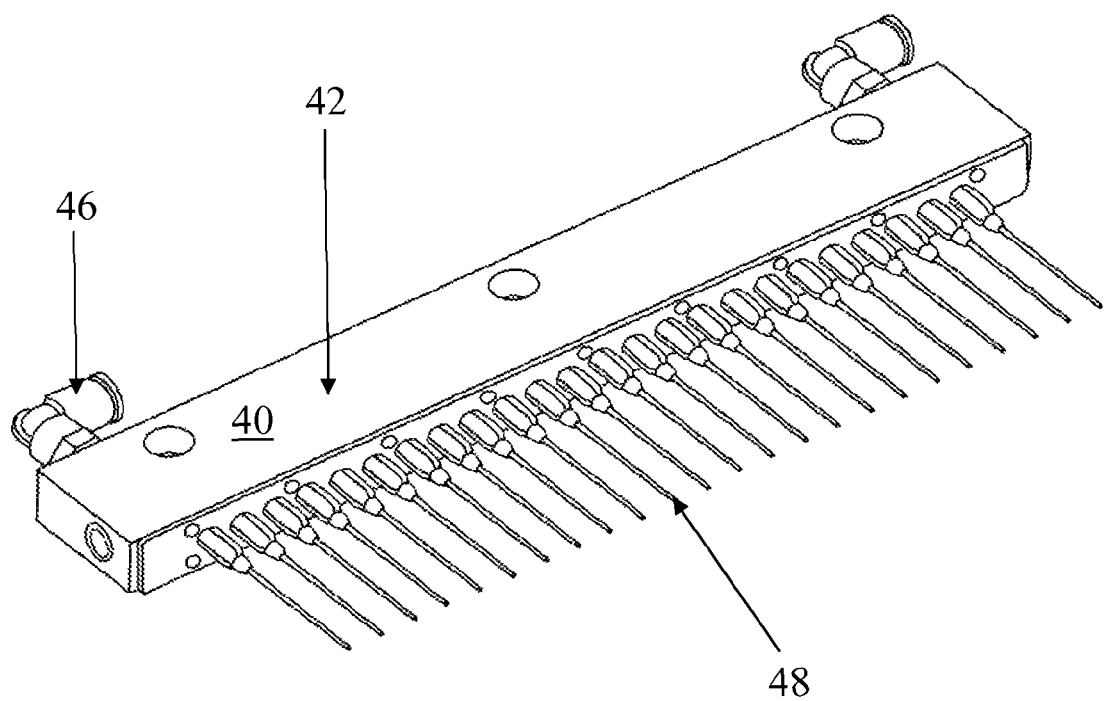
FIG. 2 is a schematic diagram illustrating a micronozzle array according to some embodiments of the present invention.

FIG. 2 is a schematic diagram illustrating a micronozzle array according to some embodiments of the present invention. The micronozzle array 40 comprises an air duct 42 and a plurality of nozzles 48, in which the air duct 42 is connected with the nozzles 48. In addition, the air duct 42 is further connected with an external channel 46. The external channel 46 is configured to provide clean gas (i.e., nitrogen and the extreme clean dry air) to the nozzles 48 via the air duct 42. In some preferred embodiments, the angle θ between the nozzles 48 and the rotation platform 30 is between 15° and 25°. The purge device having micronozzles shows a better purging efficiency when the angle θ of the nozzles 48 and the rotation platform 30 is between 15° and 25° in the embodiments. In some other preferred embodiments, the aperture diameter of each nozzle is between 0.3 mm and 3 mm. The purge device having micronozzles also shows a better purging efficiency when the aperture diameter of nozzles is between 0.3 mm and 3 mm in the embodiments.

Figure 3:
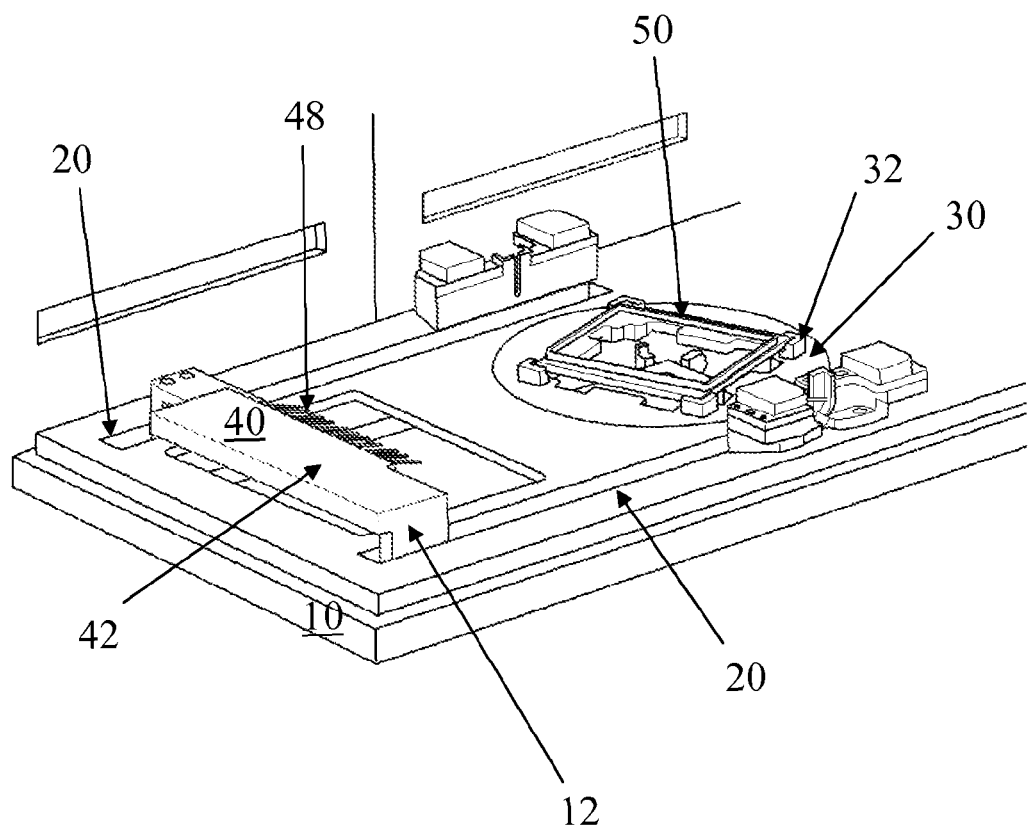
FIG. 3 is a schematic diagram illustrating an embedded rotation platform according to some embodiments of the present invention.

In some embodiments, the rotation platform 30 is installed onto the base 10 (as illustrated in FIG. 1). In some other embodiments, the rotation platform 30 is embedded into the top surface of the base 10. FIG. 3 is a schematic diagram illustrating an embedded rotation platform according to some embodiments of the present invention.

Figure 4:
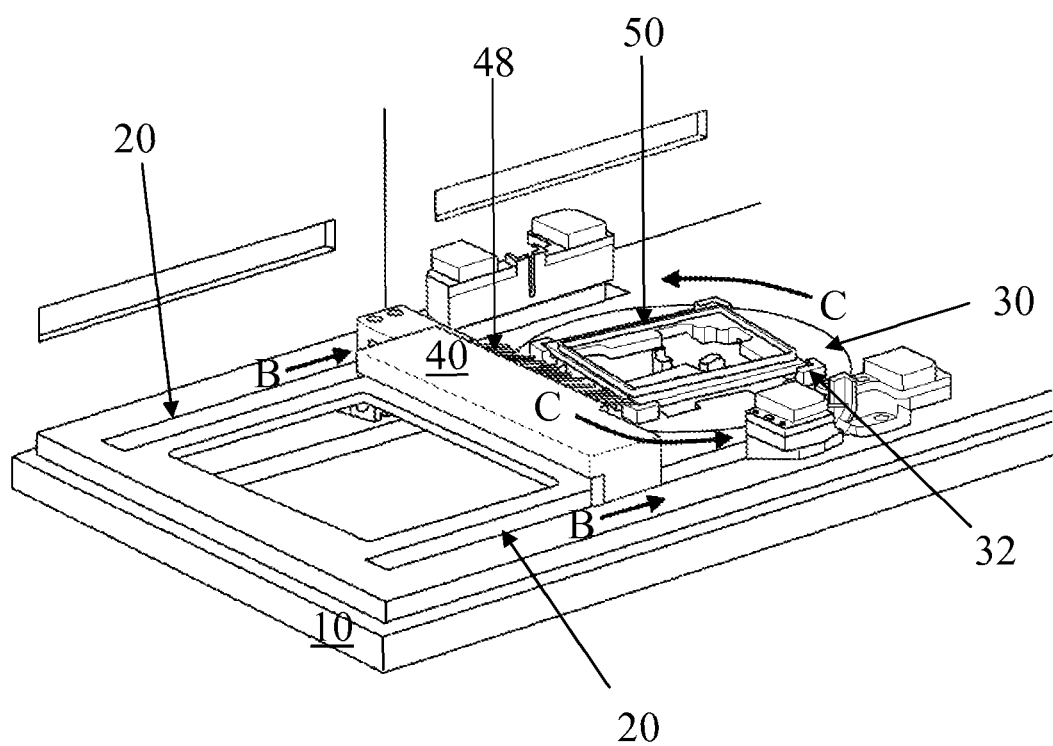
FIG. 4 is a schematic diagram illustrating the operating method of a purge device having micronozzles according to some embodiments of the present invention.

FIG. 4 is a schematic diagram illustrating the operating method of a purge device having micronozzles according to some embodiments of the present invention. The purge device having micronozzles in FIG. 4 comprises a base 10, at least one track 20 configured on the base 10, a rotation platform 30 configured on the base 10, and a micronozzle array 40 connected with the at least one track 20. The micronozzle array 40 further comprises an air duct 42 and a plurality of nozzles 48, in which the air duct 42 is connected with the nozzles 48.

The operating method of the purge device having micronozzles in FIG. 4 comprises a step of placing a subject (e.g., a photolithographic mask 50) on the rotation platform 30, a step of rotating the rotation platform 30 in the direction C, and a step of activating the micronozzle array 40 and sliding the micronozzle array 40 along the at least one track in the direction B to purge the subject.

More particularly, in the operating method of the purge device having micronozzles in FIG. 4, the rotation platform 30 is rotating in the direction C but not sliding. And the micronozzle array 40, on the other hand, is sliding back and forth along the at least one track 20 and purging the subject (e.g., the photolithographic mask 50) with the nozzles 48.

Figure 5:
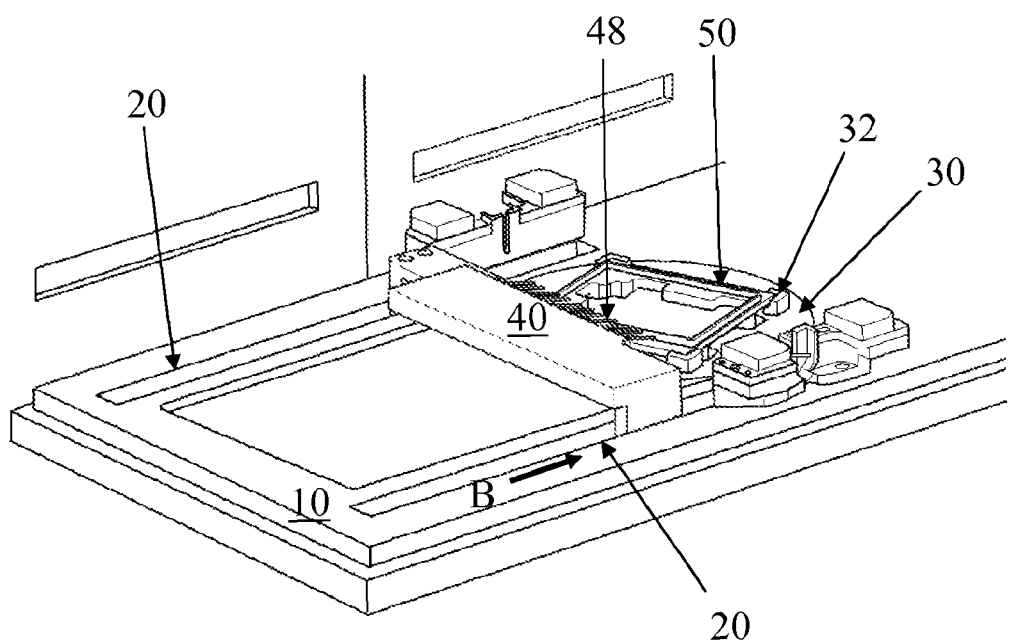
FIG. 5 is a schematic diagram illustrating the operating method of a purge device having micronozzles according to some embodiments of the present invention.

In some embodiments, the purge device having micronozzles is cooperating or further connected with a detection device. The detection device is configured to detect pollutants on photolithographic masks. The purge device having micronozzles in the embodiments may utilize the location data fed from the detection device to determine locations in need for purging. FIG. 5 is a schematic diagram illustrating the operating method of a purge device having micronozzles according to the aforementioned embodiments. The micronozzle array 40 in FIG. 5 is able to slide along the at least one track 20 to a specific location to clean pollutants on the photolithographic mask 50 rather than continuously moving back and forth.

Figure 6:
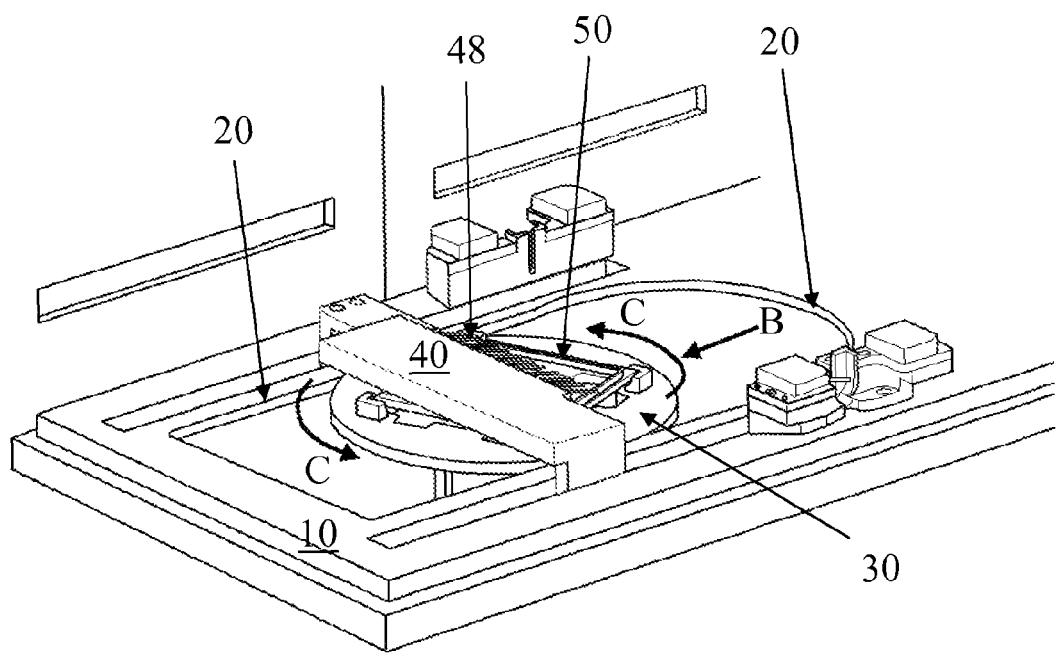
FIG. 6 is a schematic diagram illustrating the operating method of a purge device having micronozzles according to some embodiments of the present invention.

FIG. 6 is a schematic diagram illustrating the operating method of a purge device having micronozzles according to some embodiments of the present invention. The purge device having micronozzles in FIG. 4 comprises a base 10, at least one track 20 configured on the base 10, a rotation platform 30 connected with the at least one track 20, and a micronozzle array 40 configured on the base 10. The micronozzle array 40 further comprises an air duct 42 and a plurality of nozzles 48, in which the air duct 42 is connected with the nozzles 48.

The operating method of the purge device having micronozzles in FIG. 6 comprises a step of placing a subject (e.g., a photolithographic mask 50) on the rotation platform 30, a step of rotating the rotation platform 30 in the direction C and sliding the rotation platform 30 along the at least one track 20 in the direction B, and a step of activating the micronozzle array 40 to purge the subject.

More particularly, in the operating method of the purge device having micronozzles in FIG. 6, the rotation platform 30 is not only rotating in the direction C but also sliding back and forth along the at least on track 20. And the micronozzle array 40, on the other hand, is stationary and is to purge the subject (e.g., the photolithographic mask 50) with the nozzles 48. In some preferred embodiments, the rotation platform 30 rotates in the direction C and slide to a specific location to purge the subject.

Figure 7:
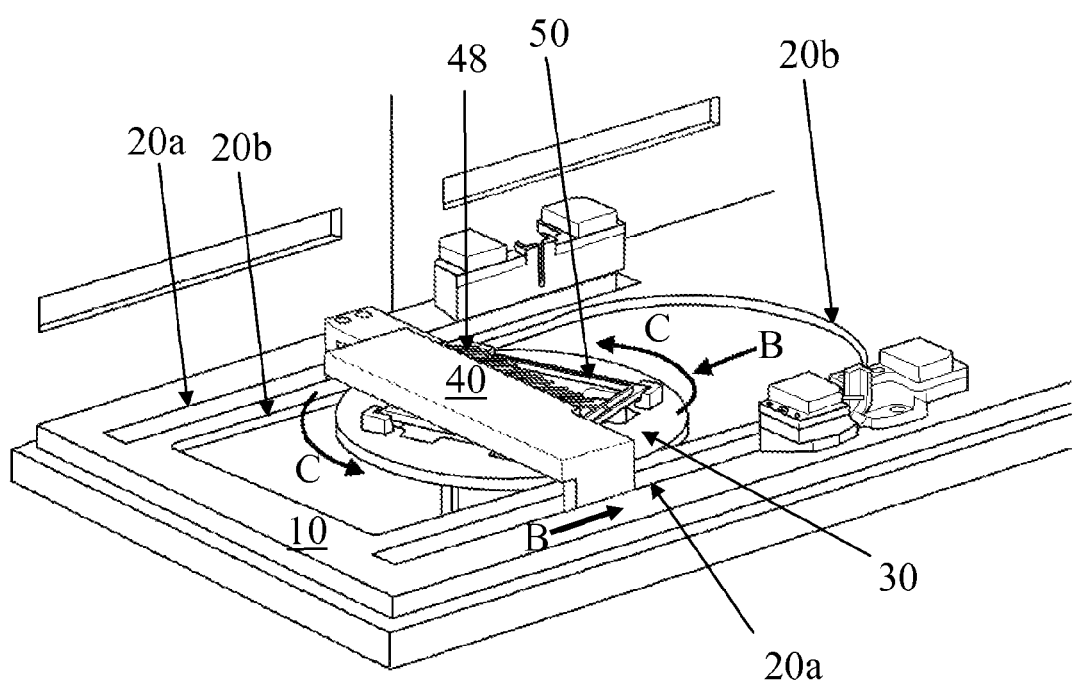
FIG. 7 is a schematic diagram illustrating the operating method of a purge device having micronozzles according to some embodiments of the present invention.

FIG. 7 is a schematic diagram illustrating the operating method of a purge device having micronozzles according to some embodiments of the present invention. The purge device having micronozzles in FIG. 7 comprises a base 10, at least one track 20 configured on the base 10, a rotation platform 30 connected with the at least one track 20, and a micronozzle array 40 connected with the at least one track 20. The micronozzle array 40 further comprises an air duct 42 and a plurality of nozzles 48, in which the air duct 42 is connected with the nozzles 48. The rotation platform 30 and the micronozzle array 40 are both connected with the at least one track 20, in which the rotation platform 30 and the micronozzle array 40 may be either connected with the same track or connected with different tracks.

The operating method of the purge device having micronozzles in FIG. 7 comprises a step of placing a subject (e.g., a photolithographic mask 50) on the rotation platform 30, a step of rotating the rotation platform 30 and sliding the rotation platform 30 along the at least one track 20b, and a step of activating the micronozzle array 40 and sliding the micronozzle array 10 along the at least one track 20a in the direction B to purge the subject.

More particularly, in the operating method of the purge device having micronozzles in FIG. 7, the rotation platform 30 is rotating and sliding back and forth or sliding to a specific location on the at least on track 20b. And the micronozzle array 40, on the other hand, is sliding back and forth or sliding to a specific location on the at least on track 20a to purge the subject.

Figure 8:
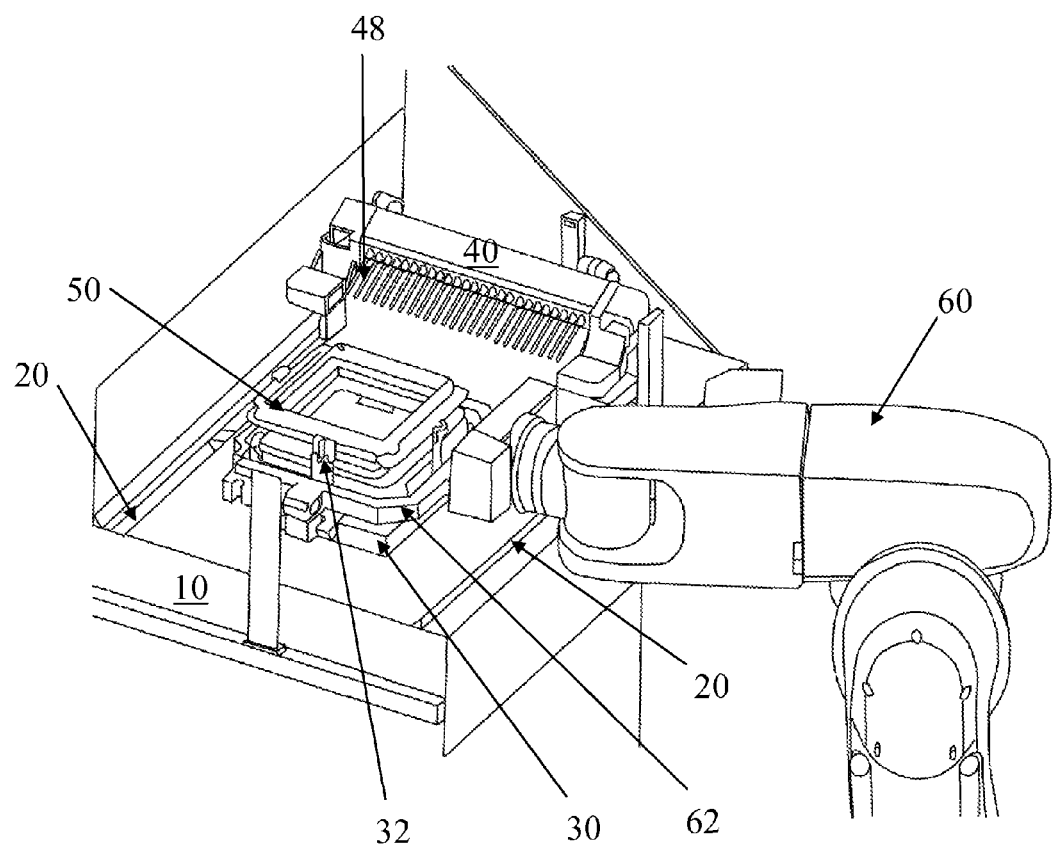
FIG. 8 is a schematic diagram illustrating a robotic arm according to some embodiments of the present invention.

In some embodiments, the purge device having micronozzles further comprises a robotic arm. FIG. 8 is a schematic diagram illustrating a robotic arm according to the aforementioned embodiments. The base 10 comprises a robotic arm 60, in which a clamp 62 is further configured on the robotic arm 60. The robotic arm 60 and the clamp 62 are configured to handle and transport the photolithographic mask 50 to the base 10 or from the base 10. However, in some other embodiments, other devices capable of handling and transporting the photolithographic mask 50 may be used to replace the robotic arm 60.

The following table provides data about the particle removal efficiencies (PREs) of a purge device having micronozzles in accordance with the present invention and the PREs of a conventional purge device. In accordance with the purge device having micronozzles in this embodiment, the nozzles and the photolithographic mask is spaced at 0.5 mm to 3 mm at minimum and the angle between the nozzles and the photolithographic mask is 20°. Moreover, the nozzle diameter is ranging from 0.1 mm to 1 mm in this embodiment. In contrary, the plurality of air knives and the photolithographic mask is spaced at 0.5 mm to 3 mm at minimum and the air knives and the photolithographic mask is 20° in accordance with the conventional purge device. Moreover, the outlet of each air knife is 150 mm long and 0.5 mm gap. In the following table, result 1 to result 5 represent the data of the purge device having micronozzles in this embodiment and result 6 to result 10 represent the data of the conventional purge device. According to the table, the purge device having micronozzles in accordance with the present invention shows better PREs in large particles, medium particles, and small particles when compared with the conventional purge device.

| | Particle | | | | | | | | |
|---|---|---|---|---|---|---|---|---|---|
| | Large Particles (Diameter >54 μm) | | | Medium Particles (Diameter = 44-54 μm) | | | Small Particles (Diameter = 10-44 μm) | | |
| Result | Count (Before) | Count (After) | PRE (%) | Count (Before) | Count (After) | PRE (%) | Count (Before) | Count (After) | PRE (%) |
| 1 | 1 | 0 | 100.0 | 1 | 0 | 100.0 | 107 | 73 | 31.8 |
| 2 | 6 | 0 | 100.0 | 1 | 0 | 100.0 | 274 | 2 | 99.3 |
| 3 | 1 | 0 | 100.0 | 2 | 0 | 100.0 | 23 | 0 | 100.0 |
| 4 | 2 | 0 | 100.0 | 1 | 0 | 100.0 | 179 | 99 | 44.7 |
| 5 | 18 | 0 | 100.0 | 4 | 0 | 100.0 | 178 | 98 | 44.9 |
| | Avg. PRE | | 100.0 | Avg. PRE | | 100.0 | Avg. PRE | | 64.1 |
| 6 | 19 | 0 | 100.0 | 11 | 6 | 45.5 | 294 | 128 | 56.5 |
| 7 | 5 | 1 | 80.0 | 5 | 2 | 60.0 | 140 | 134 | 4.3 |
| 8 | 25 | 2 | 92.0 | 14 | 3 | 78.6 | 227 | 164 | 27.8 |
| 9 | 2 | 1 | 50.0 | 2 | 1 | 50.0 | 220 | 159 | 27.7 |
| 10 | 13 | 3 | 76.9 | 12 | 4 | 66.7 | 256 | 204 | 20.3125 |
| | Avg. PRE | | 79.8 | Avg. PRE | | 60.1 | Avg. PRE | | 27.3 |

At least one embodiment of the present invention provides the purge device having micronozzles and the operating method thereof. The purge device having micronozzles improves the purging efficiency and protects the pellicle from being damaged by manipulating the relative movement between the rotation platform and the micronozzles There are many inventions described and illustrated above. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

What is claimed is:

1. A purge device having micronozzles, comprising:
a base;
at least one track configured on the base;
a rotation platform configured on the base; and
a micronozzle array configured to slide along the at least one track, wherein the micronozzle array comprises an air duct and a plurality of nozzles, and wherein the air duct is connected with the plurality of nozzles.

2. The purge device having micronozzles as claimed in claim 1, wherein the rotation platform is embedded in the base.

3. The purge device having micronozzles as claimed in claim 1, wherein an angle between the micronozzle array and the rotation platform is between 15° and 25°.

4. The purge device having micronozzles as claimed in claim 1, wherein an aperture diameter of each nozzle is between 0.3 mm and 3 mm.

5. An operating method of the purge device having micronozzles, comprising:
placing a subject on a rotation platform configured on a base;
rotating the rotation platform; and
activating a micronozzle array and sliding the micronozzle array along at least one track configured on the base to purge the subject wherein the micronozzle array comprises an air duct and a plurality of nozzles, and wherein the air duct is connected with the plurality of nozzles.

6. A purge device having micronozzles, comprising:
a base;
at least one track configured on the base;
a rotation platform connected with the at least one track; and
a micronozzle array configured on the base, wherein the micronozzle array comprises an air duct and a plurality of nozzles, and wherein the air duct is connected with the plurality of nozzles.

7. The purge device having micronozzles as claimed in claim 6, wherein the rotation platform is embedded in the base.

8. The purge device having micronozzles as claimed in claim 6, wherein an angle between the micronozzle array and the rotation platform is between 15° and 25°.

9. The purge device having micronozzles as claimed in claim 6, wherein an aperture diameter of each nozzle is between 0.3 mm and 3 mm.

10. An operating method of the purge device having micronozzles as claimed in claim 6, comprising:
placing a subject on the rotation platform;
rotating the rotation platform and sliding the rotation platform along the at least one track; and
activating the micronozzle array to purge the subject.

11. A purge device having micronozzles, comprising:
a base;
at least one track configured on the base;
a rotation platform connected with the at least one track; and
a micronozzle array connected with the at least one track, wherein the micronozzle array comprises an air duct and a plurality of nozzles, and wherein the air duct is connected with the plurality of nozzles.

12. The purge device having micronozzles as claimed in claim 11, wherein the rotation platform is embedded in the base.

13. The purge device having micronozzles as claimed in claim 11, wherein an angle between the micronozzle array and the rotation platform is between 15° and 25°.

14. The purge device having micronozzles as claimed in claim 11, wherein an aperture diameter of each nozzle is between 0.3 mm and 3 mm.

15. An operating method of the purge device having micronozzles as claimed in claim 11, comprising:
placing a subject on the rotation platform;
rotating the rotation platform and sliding the rotation platform along the at least one track; and
activating the micronozzle array and sliding the micronozzle array along the at least one track to purge the subject.

* * * * *